(12) United States Patent
Wachtler et al.

(10) Patent No.: US 8,288,849 B2
(45) Date of Patent: Oct. 16, 2012

(54) METHOD FOR ATTACHING WIDE BUS MEMORY AND SERIAL MEMORY TO A PROCESSOR WITHIN A CHIP SCALE PACKAGE FOOTPRINT

(75) Inventors: Kurt Wachtler, Richardson, TX (US); Margaret Rose Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 230 days.

(21) Appl. No.: 12/776,302

(22) Filed: May 7, 2010

(65) Prior Publication Data

US 2011/0272814 A1    Nov. 10, 2011

(51) Int. Cl.
*H01L 23/02* (2006.01)
(52) U.S. Cl. . 257/678; 257/701; 257/742; 257/E21.066; 257/E21.068; 257/E21.077; 257/E21.161; 257/E21.166; 257/E21.499; 257/E21.502; 257/E21.503; 257/E21.508; 257/E21.509
(58) Field of Classification Search ............... 257/678, 257/622, 690, 700, 701, 723, 737, 742, 777, 257/782, 787, 773, E21.066, E21.077, E21.161, 257/E21.166, E21.499, E21.502, E21.503, 257/E21.508, E21.509
See application file for complete search history.

(56) References Cited

U.S. PATENT DOCUMENTS

| | | | |
|---|---|---|---|
| 7,217,994 B2 * | 5/2007 | Zhu et al. ................. | 257/686 |
| 7,569,918 B2 | 8/2009 | Gerber et al. | |
| 7,573,139 B2 | 8/2009 | Gerber et al. | |
| 2007/0254404 A1 | 11/2007 | Gerber et al. | |
| 2008/0258285 A1 | 10/2008 | Harper et al. | |
| 2008/0258286 A1 | 10/2008 | Gerber et al. | |
| 2008/0315387 A1 | 12/2008 | Gerber et al. | |
| 2009/0079067 A1 | 3/2009 | Gerber | |
| 2009/0206455 A1 | 8/2009 | Harper et al. | |
| 2010/0096738 A1 | 4/2010 | Simmons-Matthews et al. | |

* cited by examiner

*Primary Examiner* — David Nhu
(74) *Attorney, Agent, or Firm* — Steven A. Shaw; W. James Brady; Frederick J. Telecky, Jr.

(57) ABSTRACT

A semiconductor device including a first memory die having a first memory type, a second memory die having a second memory type different from the first memory type, and a logic die such as a microprocessor. The first memory die can be electrically connected to the logic die using a first type of electrical connection preferred for the first memory type. The second memory die can be electrically connected to the logic die using a second type of electrical connection different from the first type of electrical connection which is preferred for the second memory type. Other devices can include dies all of the same type, or two or more dies of a first type and two or more dies of a second type different from the first type.

12 Claims, 1 Drawing Sheet

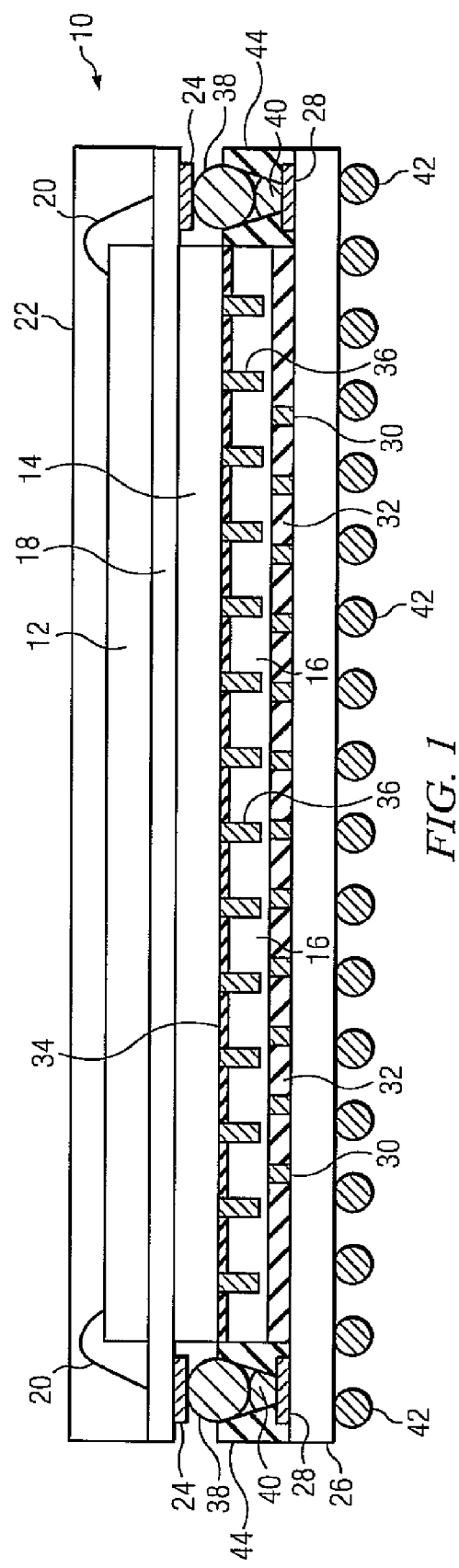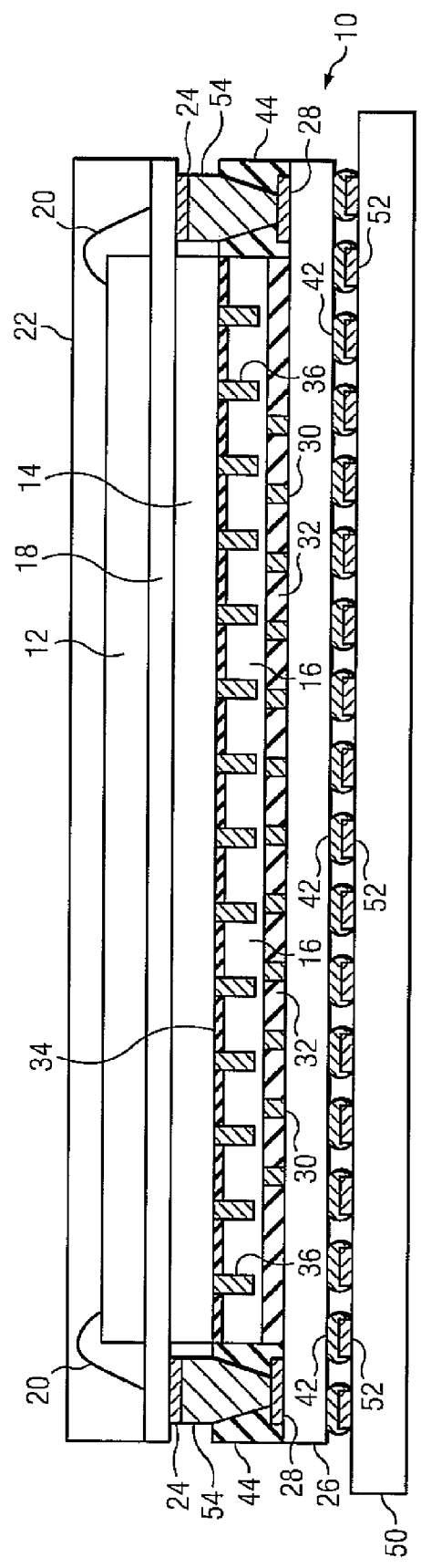

METHOD FOR ATTACHING WIDE BUS MEMORY AND SERIAL MEMORY TO A PROCESSOR WITHIN A CHIP SCALE PACKAGE FOOTPRINT

FIELD OF THE INVENTION

This invention relates to the field of semiconductor device assembly and, more particularly, to a semiconductor device method and structure which can be used to attach and electrically connect different types of devices together.

BACKGROUND OF THE INVENTION

Decreasing the size of completed device packages is an ongoing design goal in the field of semiconductor device manufacture. The electronics industry has moved from decreasing the size of packages which include a single semiconductor die (chip) to miniaturization of packages which include a plurality of chips within the same package.

For example, a "package on package" or "PoP" device can include a memory die connected with bond wires to a first substrate, and a logic die connected with bond wires to a second substrate. The first substrate can provide circuit routings (i.e. electrical traces or trace routings) and a low-density ball grid array (BGA) for connection of the memory die to the logic die, while the second substrate can provide circuit routings and a high-density BGA for connection of the logic die to a receiving substrate such as a motherboard. The BGA of the first substrate is attached to landing pads on an upper side of the second substrate. Thus the memory die can be stacked on, and electrically connected to, the logic die with short electrical connections which decreases signal delay between the two dies. Further, each die can be tested prior to assembly to insure functionality, thereby reducing scrap and rework.

SUMMARY OF THE EMBODIMENTS

In contemplating conventional package on package semiconductor designs, the inventors have realized that it may be desirable to include three or more different types of chips within the same package. However, the difficulty of interconnecting three or more different types of chips is compounded when preferred electrical connections vary for different dies. Further, providing a package having more than two dies within a chip scale package footprint is difficult.

For example, a microprocessor (processor) can require the use of memory having a high speed, low density serial input/output (I/O) data architecture such as a serial interface memory, and memory having a data architecture with a lower speed and a wider data width I/O. Packaging these devices separately requires a large area of a receiving substrate, while a single device which includes all three could provide a highly functional package with a small footprint. Combining three devices into a single package with a small footprint is difficult, however, as a large number of electrical connections must be made within a small area. Further, electrical connections between the processor and the slow, wide data width memory would be preferably short to minimize signal delay. The high speed, low density serial I/O memory is affected less than the wide memory by longer electrical connections, and thus longer connections are sufficient for serial memory.

In realizing these requirements, the inventors have developed a semiconductor package which can include three or more different die types, for example two different memory types and a processor, which can provide electrical connections between two different memory types and the processor using different types of electrical connections. The device can be formed to provide a package within a chip scale device footprint. Embodiments of the present teachings include a dense package having a small footprint.

An embodiment of a device can include a first memory die type, such as a high speed serial I/O memory die, physically connected to a front surface of a first substrate, and electrically connected to routings on and within the first substrate, for example using bond wires or a flip chip connection. The routings can be electrically connected to pads on a back surface of the first substrate.

The device can further include a processor formed with through substrate vias (TSVs) which pass data between a front (circuit) side and a back (noncircuit) side of the processor. The processor can be physically connected to a front surface of a second substrate using a flip chip connection, and electrically connected to routings within the second substrate using, for example, copper pillars. Routings on the second substrate can electrically connected to pads on a front surface of the second substrate, which are in turn connected to pads on a back surface of the second substrate with routings through the second substrate.

The device can also include a second memory die type such as a low speed, wide bus memory die, physically connected to the back side of the processor, with a front side of the second memory die facing the back side of the processor. The second memory die can be electrically connected to the processor through the TSVs.

The pads on the back surface of the first substrate can be connected to the pads on the front surface of the second substrate with solder connections such as a ball grid array, through conductive paste, etc.

A data path from the first memory die to the processor can thus be from the die through a bond wire or flip chip connection to the routings of the first substrate, to pads on the back surface of the first substrate, through solder or conductive paste to the pads on the front surface of the second substrate, through trace routings in the second substrate, and through the copper pillars to the processor.

A data path from the second memory die to the processor can be through the TSVs from the back side to the front side of the processor.

Thus the semiconductor device can include a first memory die with a first memory type, a second memory die with a second memory type, and a third die which can be a processor. The first memory die can be electrically connected to the processor using a first connection type and the second memory die can be electrically connected to the processor using a second connection type which is different than the first connection type.

The device can be electrically connected with a receiving substrate such as a printed circuit board, motherboard, system board, ceramic substrate, etc. through BGA connections to the pads on the back surface of the second substrate.

It will be understood that while the package is suitable for three different die types, the package can also be used to connect dies of the same type together, or a combination of same die types with different die types.

BRIEF DESCRIPTION OF THE DRAWINGS

The accompanying drawings, which are incorporated in and constitute a part of this specification, illustrate embodiments of the present teachings and, together with the description, serve to explain the principles of the disclosure. In the figures:

FIG. 1 is a cross section of an exemplary embodiment of the present teachings; and FIG. 2 is a cross section of a structure similar to FIG. 1 after attachment to a receiving substrate.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the present teachings, an example of which is illustrated in the accompanying drawings. Wherever possible, the same reference numbers will be used throughout the drawings to refer to the same or like parts.

Increasing the number and types of devices which can be packaged into a single form factor allows designers more options for device packages and can reduce the area required for the devices. FIG. 1 depicts a device 10 in accordance with an embodiment of the present teachings which can include two memory dies, each providing different memory types, and a logic die which are packaged together. It is contemplated that more than two memory types and more than one logic die can be packaged together in other embodiments. Also, while the package is useful to for packaging three or more different types of semiconductor dies, it is contemplated that in other embodiments two or more (or all) of the semiconductor dies can be of the same type.

Device 10 can include one (or more) first memory die 12, one (or more) second memory die 14, and (one or) more logic die 16. The first memory die 12 can include a memory type having a high speed, low-density serial input/output (I/O) data architecture, such as a serial interface memory. The second memory die 14 can include a memory type having a data architecture which has a lower speed and a wider data width (i.e. a high-density, wide bus) I/O. The logic die 16 can include a semiconductor die such as a microprocessor.

In an embodiment, a back (noncircuit) side of the first memory die 12 can be physically attached to a front surface of a first substrate 18 using a die attach material (not individually depicted). The first substrate can include a printed circuit board (PCB), a semiconductor substrate, a ceramic substrate, a tape automated bonding (TAB) tape structure, or another workable substrate having circuit routings on and through the substrate. Bond pads (not individually depicted) on a front (circuit) side of the first memory die 12 can then be electrically connected to landing pads (not individually depicted) connected to circuit routings on the front surface of the first substrate 18 with bond wires 20. In another embodiment, the first memory die 12 can be electrically connected to circuit routings on the front of the first substrate using a flip-chip attachment. Encapsulation material 22 can be formed to protect the circuitry of the first memory die 12 and first substrate 18. The first substrate 18 further includes a plurality of pads 24 on the back surface which are electrically connected to the circuit routings on the front surface of the substrate 18 through wiring within the substrate 18, and to circuitry on the first memory die 12 through the bond wires 20.

Device 10 further includes a second substrate 26 having circuit routings on a front surface which is connected to a plurality of pads 28 on the front surface of the second substrate. In this embodiment, a front (circuit) side of the logic die 16 is adjacent (i.e. faces) the front surface of the second substrate 26 in flip-chip fashion. A plurality of electrical connections 30, for example a plurality of conductive pillars which can include copper pillars separated by a dielectric underfill 32, physically connect the logic die to the front surface of the second substrate, and electrically connect circuitry of the logic die 16 to circuit routings on the front surface of the second substrate 26.

In this embodiment, a front (circuit) side of the second memory die 14 is physically attached to a back (noncircuit) side of the logic die 16 using a material 34 such as a dielectric material as a die attach material. Circuitry on the front side of the second memory die 14 can be electrically connected with circuitry on the front side of the logic die 16 using through silicon vies (TSVs) 36 formed within the logic die 16. In another embodiment, the physical connection, as well as the electrical connection, can be performed using a Z-axis conductor. The TSVs thus extend from the back of the logic die 16 and through the logic die to electrically connect with circuitry on the front side of the logic die.

The first substrate 18 can further include a ball grid array (BGA) 38 electrically connected to pads 24 on the back surface of the first substrate 18. The pads 28 on the front surface of the second substrate 26 can be electrically connected to the pads 24 on the back surface of the first substrate 18 using a conductors 38, 40 such as solder or a conductive paste. FIG. 1 depicts the use of a solder for conductor 40 and for BGA 38 prior to performing a reflow process to electrically connect first substrate pads 24 with the second substrate pads 28. Once the reflow process is complete, the solder will flow to fill the opening between pads 24, 28 and form a continuous conductor.

The second substrate pads 28 can be electrically routed to circuitry on the front surface of substrate 26 and to a plurality of high-density BGA connections 42 on the back surface of the second substrate 26. The BGA connections 42 can connect the completed device to a receiving substrate, such as a printed circuit board, motherboard, system board, ceramic substrate, etc.

A preformed mold compound 44, which can be formed prior to reflowing solder 38, 40, can prevent the flow of solder away from the desired area when the solder is in its molten state.

Thus in the embodiment of FIG. 1, circuitry on a first memory die 12 is connected to circuit routings on and within the first substrate 18 using bond wires 20. The circuit routings of the first substrate are electrically connected to the pads 24 on the back surface of the first substrate 18. BGA connections 38, and electrical connections 40, electrically connect pads 24 on the back surface of the first substrate to pads 28 on the front surface of the second substrate 26. The pads 28 can be electrically connected to circuitry on the front surface of the second substrate 26 and to BGA connections 42 using circuit routings on and within the second substrate 26. Using this conductive data pathway, data can be passed between the first memory die 12, the logic die 16, and to external package locations 42. In the FIG. 1 embodiment, this conductive data pathway between the first memory die 12 and the logic die 16 does not include the TSV connections 36.

Further, circuitry on the front side of the second memory die 14 is connected to circuitry on the front side of the logic die 16, for example using TSV connections 36. Circuitry from the front side of the logic die 16 is electrically connected to circuitry on the front side of the second substrate 26 using, for example, copper pillars 30. Circuit routings on and in the second substrate 26 electrically connect to BGA connections 42 and to pads 28. Using this conductive pathway, data can be passed between the second memory die 14, the logic die 16, and to external package locations 42.

The first memory die 12 can include a die having low-density, high-speed serial I/O, while the second memory die 14 can include a die having high-density, low speed wide I/O. The BGA connections 38 would facilitate the low-density, high-speed electrical connection between the first memory die 12 and the logic die 16, while the TSV connections 36 would facilitate the high-density, low-speed electrical connections between the second memory die 14 and the logic die 16. Copper pillars 30 can be formed with a small pitch and would thus facilitate the high-density electrical connections between the logic die 16 and the second substrate 26, and to external package locations 42. Thus first memory die can be electrically connected to the logic die using a first type of electrical connection preferred for the first memory type, while the second memory die can be electrically connected to the logic die using a second type of electrical connection different from the first type of electrical connection which is preferred for the second memory type. The device can provide the three dies within a chip scale package footprint.

FIG. 2 depicts the device of FIG. 1 subsequent to attachment to a receiving substrate 50 such as a printed circuit board, system board, motherboard, system board, etc. The BGA connections 42 provide electrical connection to pads 52 on the receiving substrate 50.

FIG. 2 further depicts a plurality of continuous electrical connections 54 formed from the FIG. 1 BGA connections 38, 40 subsequent to a solder reflow process. Electrical connections 54 electrically connect pads 24 on the back surface of the first substrate 18 to pads 28 on the front surface of the second substrate 26. BGA connections 38, 40 of FIG. 1 can also be formed using another electrically conductive material such as a conductive paste. The BGA connections 42 are adapted to be connected to the receiving substrate as depicted, and to transfer data from/to the first die 12, the second die 14, and the third die 16 to the receiving substrate 50.

While the package can include the use of three (or more) different types of semiconductor dies, it is contemplated that all dies may be of the same type, or two or more may be of the same type with one or more being a different type.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A semiconductor device, comprising:
a first substrate comprising a front surface with circuit routings thereon and a back surface comprising a plurality of conductive pads electrically connected to the circuit routings;
a first semiconductor die electrically connected to the plurality of conductive pads and attached to the first substrate;
a second substrate comprising a front surface with circuit routings and a plurality of conductive pads thereon, wherein the circuit routings on the front surface of the second substrate are electrically connected to the plurality of conductive pads on the front surface of the second substrate;
a second semiconductor die electrically connected and attached to the second substrate and comprising a plurality of through substrate vias (TSVs) therein;
a third semiconductor die electrically connected to the second semiconductor die through the TSVs and attached to the second semiconductor die;
a plurality of conductors which electrically connect the plurality of conductive pads on the back surface of the first substrate to the plurality of conductive pads on the front surface of the second substrate;
a first connection type which electrically connects the first semiconductor die to the second semiconductor die; and a second connection type which electrically connects the third semiconductor die to the second semiconductor die, wherein the first connection type is different than the second connection type.

2. The semiconductor device of claim 1, further comprising:
the first semiconductor die is a first memory die comprising a first memory type;
the second semiconductor die is a logic die; and
the third semiconductor die is a second memory die comprising a second memory type different from the first memory type.

3. The semiconductor device of claim 1, wherein:
the first semiconductor die is a first memory die comprising a serial input/output (I/O) data architecture comprising a data width and a speed;
the second semiconductor die is a microprocessor; and
the third semiconductor die is a second memory die comprising a data architecture comprising a lower speed than the first semiconductor die and a wider data width than the first semiconductor die.

4. The semiconductor device of claim 1, further comprising:
a ball grid array (BGA) on a back surface of the second substrate, wherein the BGA is adapted to be connected to a receiving substrate and to transfer data from the first semiconductor die, the second semiconductor die, and the third semiconductor die to the receiving substrate.

5. The semiconductor device of claim 1, further comprising:
a plurality of bond wires which electrically connect the first semiconductor die to the circuit routings on the front surface of the first substrate.

6. The semiconductor device of claim 1, wherein the plurality of conductors which electrically connect the plurality of conductive pads on the back surface of the first substrate to the plurality of conductive pads on the front surface of the second substrate are a plurality of reflowed ball grid array (BGA) structures.

7. The semiconductor device of claim 1, further comprising:
the first semiconductor die is electrically connected to the circuit routings on the front surface of the first substrate with a plurality of bond wires; and
the second semiconductor die is electrically connected to the circuit routings of the second substrate with a plurality of conductive pillars.

8. The semiconductor device of claim 1, wherein:
the first connection type comprises the circuit routings on the first substrate, the plurality of conductive pads on the back surface of the first substrate, the conductive pads on the front surface of the second substrate, and the circuit routings on the front surface of the second substrate; and
the second connection type comprises the plurality of TSVs.

9. A semiconductor device, comprising:
a first semiconductor die electrically connected to first circuit routings on a front surface of a first substrate;
a second semiconductor die electrically connected to second circuit routings on a front surface of a second substrate; and
a third semiconductor die electrically connected to the second semiconductor die through a plurality of through substrate vias at a back side of the second semiconductor die, wherein the first semiconductor die is electrically connected to the second semiconductor die through a data pathway which extends through the first circuit routings on the front surface of the first substrate and through the second circuit routings on the front surface of the second substrate.

10. The semiconductor device of claim 9, further comprising:
a conductive
a conductive pad on a back surface of the first substrate;
a conductive pad on the front surface of the second substrate; and
an electrical connection which electrically connects the conductive pad on the back surface of the first substrate to the conductive pad on the front surface of the second substrate, wherein the data pathway further extends through the electrical connection which electrically connects the conductive pad on the back surface of the first substrate to the conductive pad on the front surface of the second substrate.

11. The semiconductor device of claim 10, further comprising:
a plurality of ball grid array (BGA) connections on a back surface of the second substrate adapted to electrically connect the first semiconductor die, the second semiconductor die, and the third semiconductor die to a receiving substrate.

12. The semiconductor device of claim 11, further comprising:
the first substrate is a printed circuit board; and
the second substrate is a printed circuit board.

* * * * *